United States Patent
Kemppinen

(10) Patent No.: US 8,842,424 B2
(45) Date of Patent: Sep. 23, 2014

(54) JOINT COVER

(75) Inventor: Pasi Tuomo Antero Kemppinen, Tampere (FI)

(73) Assignee: Nokia Corporation, Espoo (FI)

( * ) Notice: Subject to any disclaimer, the term of this patent is extended or adjusted under 35 U.S.C. 154(b) by 350 days.

(21) Appl. No.: 13/307,423

(22) Filed: Nov. 30, 2011

(65) Prior Publication Data

US 2013/0135837 A1    May 30, 2013

(51) Int. Cl.
H05K 7/00 (2006.01)
H05K 5/00 (2006.01)
G06F 1/16 (2006.01)
H05K 5/02 (2006.01)

(52) U.S. Cl.
CPC ............ H05K 5/0226 (2013.01); G06F 1/1681 (2013.01); G06F 1/1616 (2013.01)
USPC ...................................... 361/679.27; 361/755

(58) Field of Classification Search
CPC ... G06F 1/1616; G06F 1/1681; H05K 5/0226; H05K 1/0393
USPC ............ 361/600, 679.01, 748, 752, 755, 807, 361/809, 679.26–679.28; 455/575.1, 575.3, 455/575.4
See application file for complete search history.

(56) References Cited

U.S. PATENT DOCUMENTS

| 8,120,899 | B2* | 2/2012 | Kim ......................... 361/679.28 |
| 2006/0133052 | A1* | 6/2006 | Harmon et al. ............... 361/752 |
| 2008/0125195 | A1 | 5/2008 | Maenpaa ................... 455/575.3 |
| 2009/0291719 | A1 | 11/2009 | Christensen ............... 455/575.3 |
| 2009/0322690 | A1 | 12/2009 | Hiltunen et al. ............... 345/173 |
| 2010/0164837 | A1* | 7/2010 | Kao et al. ....................... 345/1.3 |
| 2013/0010405 | A1* | 1/2013 | Rothkopf et al. ......... 361/679.01 |
| 2013/0155598 | A1* | 6/2013 | Kontkanen et al. ...... 361/679.27 |

OTHER PUBLICATIONS

•Printout of image results of Internet search regarding "PSION 3", Dec. 5, 2011, 5 pages.
•Printout of image results of Internet search regarding "Nintendo DS", Dec. 5, 2011, 3 pages.
Printout of image results of Internet search regarding "Kyocera Echo, Dec. 5, 2011, 3 pages".

* cited by examiner

*Primary Examiner* — Bernard Rojas
(74) *Attorney, Agent, or Firm* — Harrington & Smith

(57) ABSTRACT

An apparatus including a cover; a first connection section; and a second connection section. The first connection section includes a first hinge connected to a first end of the cover. The first hinge is configured to pivotably connect the first end of the cover to a first housing section. The second connection section is connected to a second end of the cover. The second connection section is configured to connect the second end of the cover to a second housing section which is pivotably connected to the first housing section. The second connection section is configured to provide both rotational and longitudinal sliding motion of the second end of the cover on the second housing section.

18 Claims, 14 Drawing Sheets

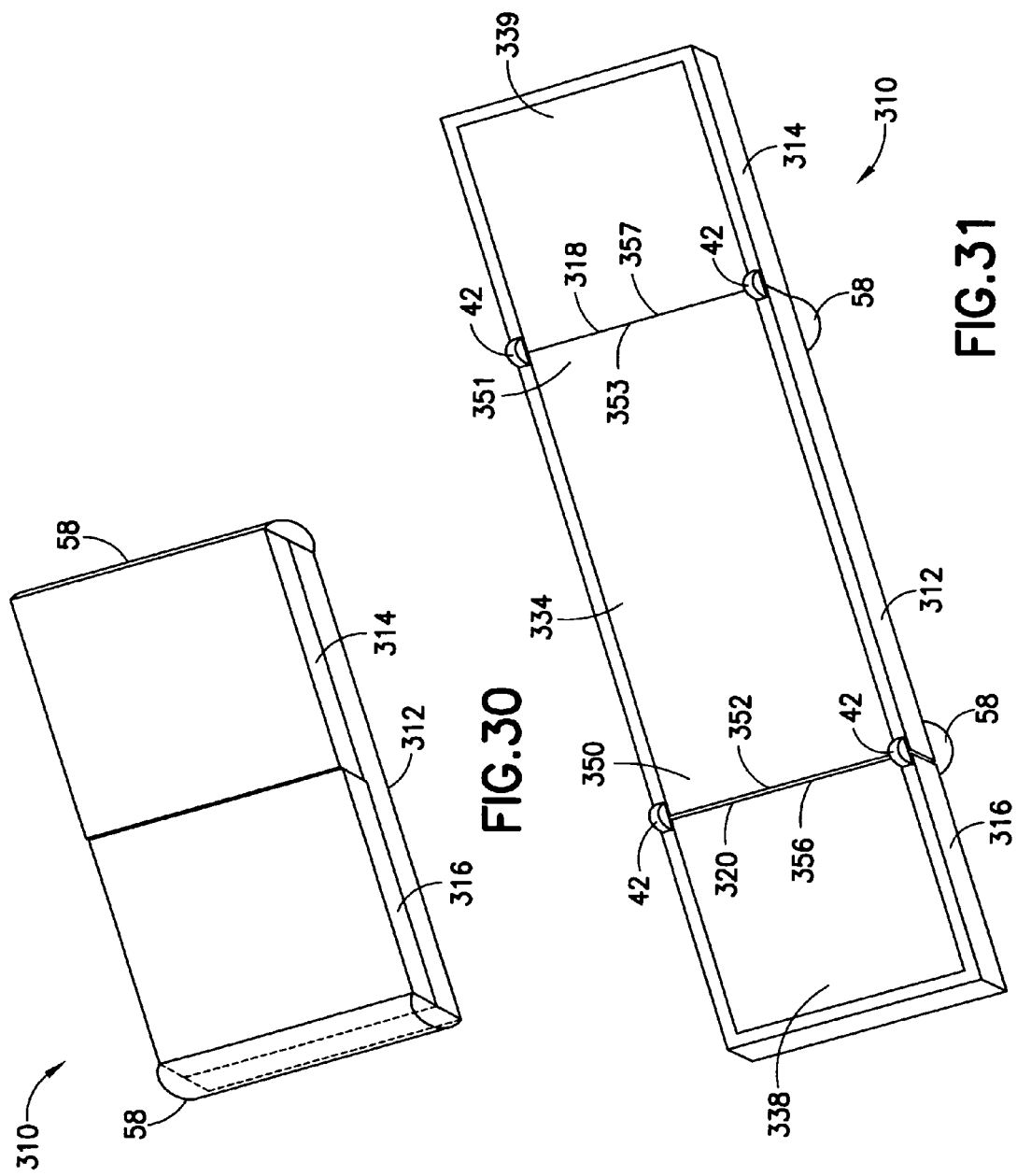

JOINT COVER

BACKGROUND

1. Technical Field

The exemplary and non-limiting embodiments of the invention relate generally to a movable connection and, more particularly, to a cover at the movable connection.

2. Brief Description of Prior Developments

Folding hand-held electronic devices having at least one display are known. A connection, such as a hinge, is ordinarily provided between two housing sections to allow the device to flip open and closed. As hand-held electronic devices are getting smaller, it can be difficult for a user to properly see information on a display of the device. It is known to use multiple stationary displays together to show different portions of a single image. However, spacing between the displays, such as by housings of the displays, is clearly visible and disrupts the perception of the image to the user.

SUMMARY

The following summary is merely intended to be exemplary. The summary is not intended to limit the scope of the claims.

In accordance with one aspect, an apparatus is provided including a cover; a first connection section; and a second connection section. The first connection section includes a first hinge connected to a first end of the cover. The first hinge is configured to pivotably connect the first end of the cover to a first housing section. The second connection section is connected to a second end of the cover. The second connection section is configured to connect the second end of the cover to a second housing section which is pivotably connected to the first housing section. The second connection section is configured to provide both rotational and longitudinal sliding motion of the second end of the cover on the second housing section.

In accordance with another aspect, an apparatus is provided comprising a first section comprising a first housing and a first display on the first housing; a second section comprising a second housing and a second display on the second housing; a connection between the first and second sections to allow the first section to rotate relative to the second section between a closed configuration and an open configuration; and a cover comprising a rigid cover member. In the open configuration, opposite side edges of the first and second displays are in close proximity to each other and the first and second displays are viewable from a same direction. In the closed configuration, the rigid cover member at least partially covers ends of the first and second sections at a same side of the apparatus. The rigid cover member has a first end pivotably connected to the first housing and an opposite second end pivotably connected to the second housing.

In accordance with another aspect, a method comprises pivotably rotating a first housing section relative to a second housing section at a joint hinge from a closed folded configuration to an open unfolded configuration, where the first and second housing sections each comprise a display which generally face a same direction in the open configuration, and where ends of the displays are substantially adjacent each other in the open configuration; and moving a cover from a first location, at first sides of the first and second housing sections in the closed configuration, to a second location away from an area between the first sides of the first and second housing sections in the open configuration, where the first sides face each other in the open configuration, and where the cover pivots at a first hinge between the cover and the first housing section.

In accordance with another aspect, a method comprises rotatably connecting a first housing section to a second housing section at a joint between a closed folded configuration and an open unfolded configuration, where the first and second housing sections each comprise a display with ends which are substantially adjacent and directly facing each other in the open configuration; and connecting a cover member to the first and second housing sections at the joint, where a first end of the cover member is pivotably connected to the first housing section and an opposite second end of the cover member is both pivotably and longitudinally slideably connected to the second housing section.

BRIEF DESCRIPTION OF THE DRAWINGS

The foregoing aspects and other features are explained in the following description, taken in connection with the accompanying drawings, wherein:

FIGS. 30-31 show perspective views of another example embodiment in closed and open configurations;

DETAILED DESCRIPTION OF EMBODIMENTS

Figure 1:
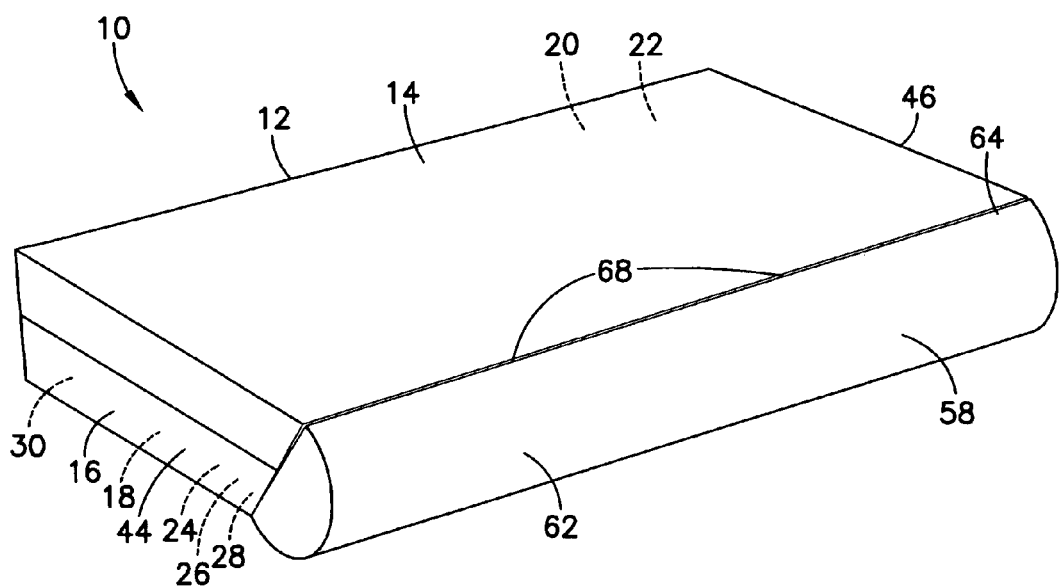
FIG. 1 is a perspective view of an example embodiment.

Referring to FIG. 1, there is shown a perspective view of an apparatus 10 incorporating features of an example embodiment. Although the features will be described with reference to the example embodiment shown in the drawings, it should be understood that features can be embodied in many alternate forms of embodiments. In addition, any suitable size, shape or type of elements or materials could be used.

Figure 2:
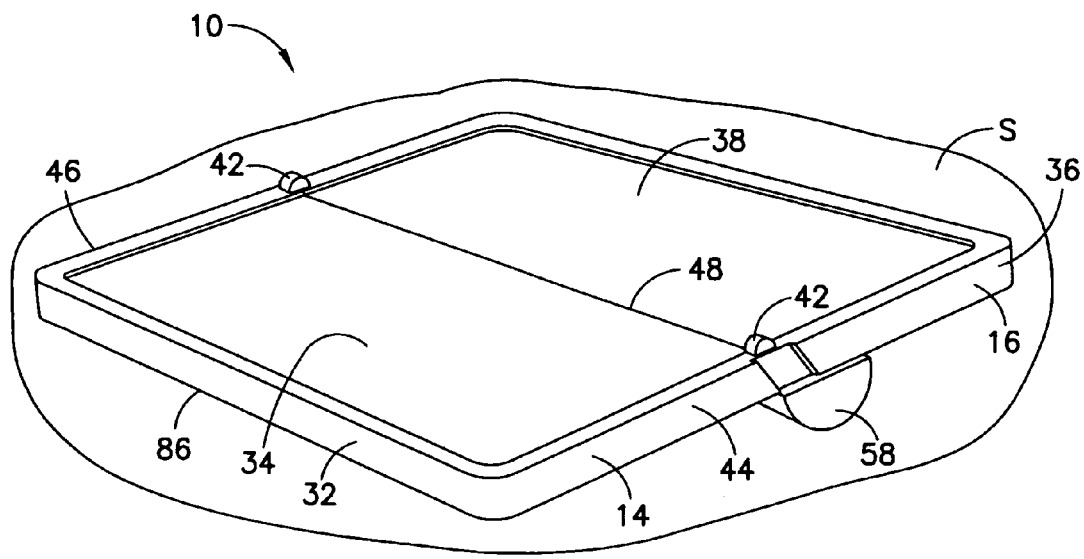
FIG. 2 is a perspective view of the apparatus shown in FIG. 1 is an unfolded, open configuration.

The apparatus 10 is a hand-held portable electronic device. The apparatus 10 can comprise, for example, a telephone application, Internet browser application, camera application, video recorder application, music player and recorder application, email application, navigation application, gaming application, and/or any other suitable electronic device application. The apparatus 10, in this example embodiment, comprises a housing 12 which is adapted to be reconfigured into different configurations. The apparatus 10 comprises a first section 14 movably connected to a second section 16. The first and second sections 14, 16 can be moved relative to each other to obtain the different configurations. FIG. 1 shows the apparatus 10 in a closed, folded configuration. FIG. 2 shows the apparatus in an open unfolded configuration.

Electronic circuitry 18 is located in the first and second sections 14, 16. The circuitry 18 can comprise, for example, a receiver 20, a transmitter 22, a controller 24 which can include at least one processor 26, at least one memory 28, and software. A rechargeable battery 30 is also provided to power the apparatus 10. However, all of these features are not necessary to implement the features described below. Thus, for example, features could be used in any suitable type of device, such as a telephone, a hand-held game, a television remote control, a cable box remote control, a PDA, a laptop computer, or a folding tablet-type computer device for example. Portions of the electronic circuitry 18 or other components could also be on or in the cover 58. For example, the cover 58 could comprise keys, sensors, a camera, a speaker, etc.

Figure 3:
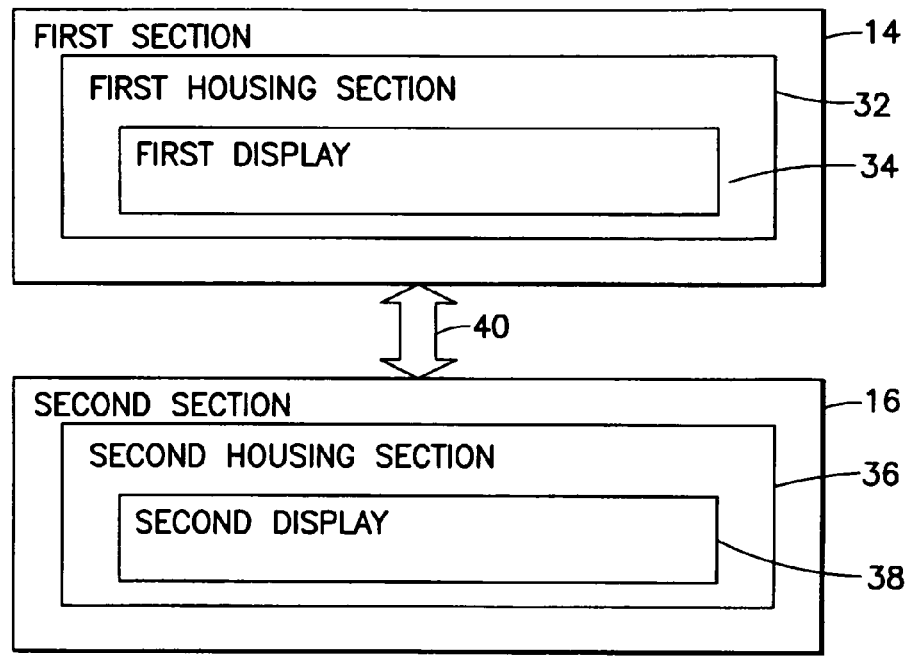
FIG. 3 is a diagram illustrating some of the components of the apparatus shown in FIG. 1.

Referring also to FIG. 3, the first section 14 generally comprises a first housing section 32 of the housing 12 and a first display 34. The second section 16 generally comprises a second housing section 36 of the housing 12 and a second display 38. The first and second sections 14, 16 are movably connected to each other by a connection 40.

In the example embodiment shown, the first and second displays 34, 38 are the same. However, in alternate embodiments they could be different. Each display 34, 38 comprises an LCD electronic display. However, in alternate embodiments any suitable type of electronic display could be provided. Each display 34, in this example is a touch screen display which functions as both a display screen and as a user input. However, features described herein could be used in a display which does not have a touch, user input feature. A display screen section of each display 34, 38 is connected to a display driver. A touch screen section of each display 34, 38 is connected to a touch screen controller. The display drivers and touch screen controllers are connected to the controller 24.

Figure 9:
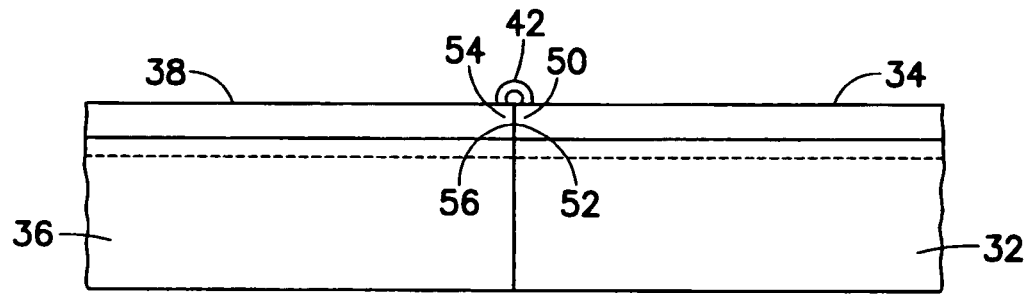
FIG. 9 is a partial schematic view showing location of the facing edges of the displays in the fully open configuration shown in FIGS. 2, 7 and 8.
Figure 10:
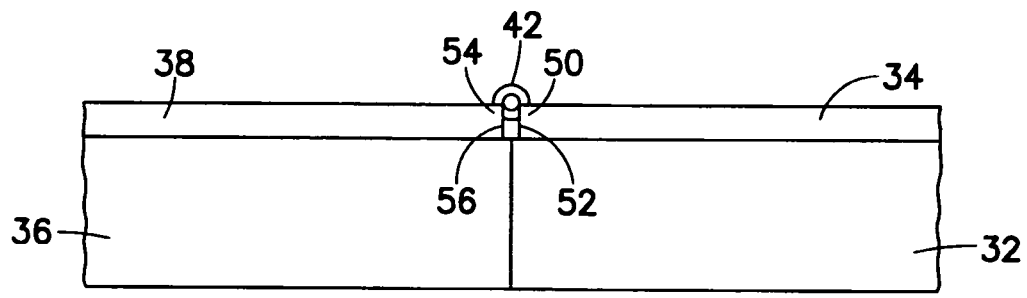
FIG. 10 is a diagram similar to FIG. 9 showing an alternate example embodiment.

Referring also to FIGS. 4-8, the movable connection 40 in this example comprises two hinges 42 located at opposite sides 44, 46 (see FIGS. 1 and 2) of the housing sections 32, 36 at the joint 48 between the first and second sections 14, 16. The first display 34 has an end 50 with an edge 52 located at the joint 48. Likewise, the second display 38 has an end 54 with an edge 56 located at the joint 48. As illustrated in FIG. 9, the hinges 42 are not located between the ends 50, 54. The hinges 42 are located outside of the area between the edges 52, 56. This allows the ends 50, 54 to be positioned very close to each other in the unfolded, open configuration; and perhaps touch each other. Because the hinges 42 are not located in the gap between the ends 50, of the displays, the ends of the displays can be located much closer to each other than in conventional devices without portions of the housings 32, 36 between the edges 52, 56. At least portions of the end edges 52, 56 can directly face each other without portions of the housing between the opposing edges. As illustrated in FIG. 10, an alternate example embodiment can comprise the edges 52, 56 being slightly spaced from each other due to contact of portions of the housings 32, 36 with each other at the end of travel to the unfolded open position.

Figure 4:
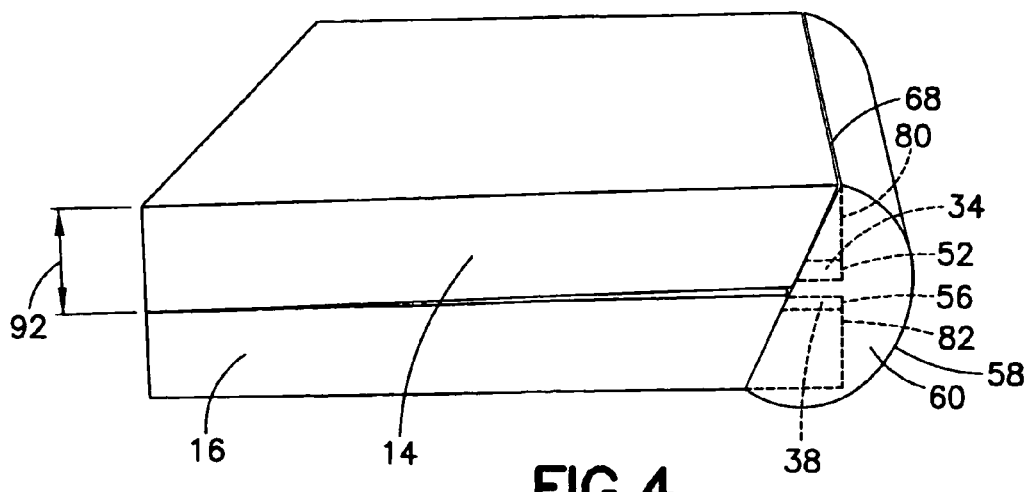
FIG. 4 is a side view of the apparatus shown in FIG. 1 in a folded, closed configuration.

Electrical conductors extend between the two sections 14, 16 through the joint 48. A cover 58 is provided to protect and enclose those conductors, and to protect the edges 52, 56 of the displays 34, 38 when the apparatus 10 is not in the unfolded, open configuration. As seen in FIG. 4, if the cover 58 was not provided, the edges 52, 56 would be exposed and vulnerable to damage.

Figure 11:
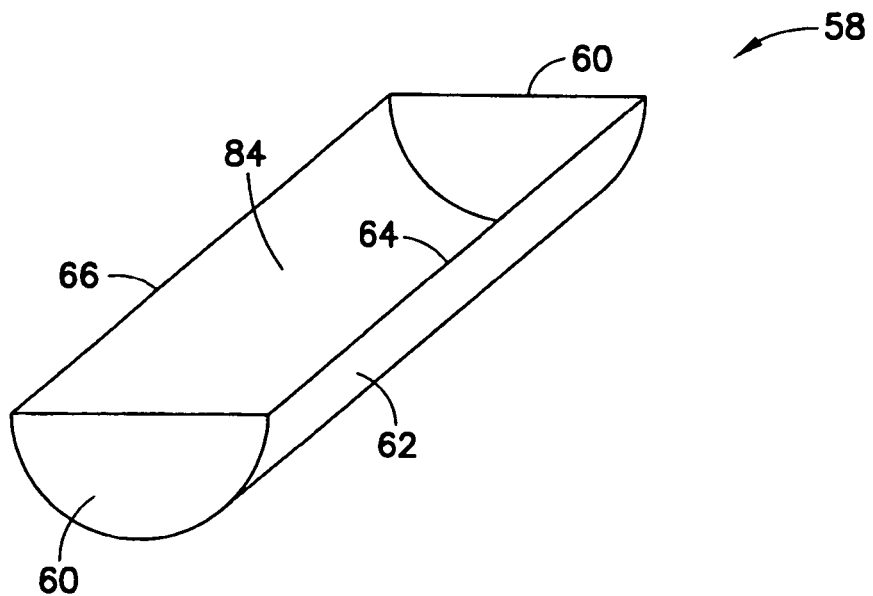
FIG. 11 is a perspective view of the cover shown in FIG. 1.

Referring also to FIG. 11, the cover 58 comprises a member with opposite end walls 60 located at the opposite sides 44, 46 of the housing sections 32, 36, and a curved wall 62 forming first end 64 and second end 66. The first end 64 is pivotably connected to the first housing section 32 at a first connection section. In the example shown, the first connection section comprises at least one first hinge 68 (see FIG. 1). In an alternate example embodiment a movable connection other than merely a hinge could be provided as the first connection section. The second end 66 is movably connected to the second housing section 36 by a second connection section. In the example shown, the second connection section comprises a slide 70 and a pivot 72 (see FIG. 8). The pivot 72 rotatably connects the second end 66 of the cover to the slide 70. The slide 70 is longitudinally slideably connected to the second housing section 36. In an alternate example embodiment a movable connection other than merely a slide and pivot could be provided as the second connection section.

Figure 5:
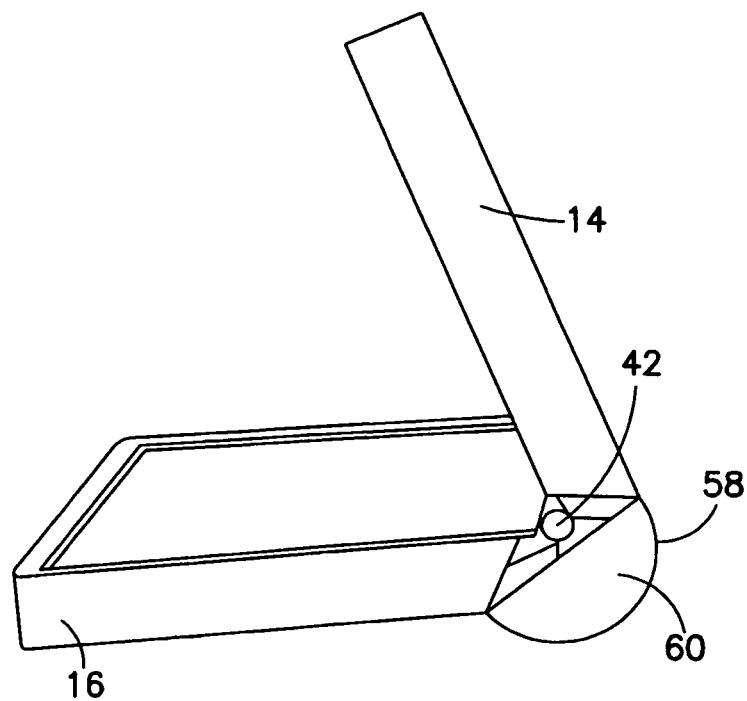
FIG. 5 is a side view similar to FIG. 4, but in an intermediate unfolded position.
Figure 6:
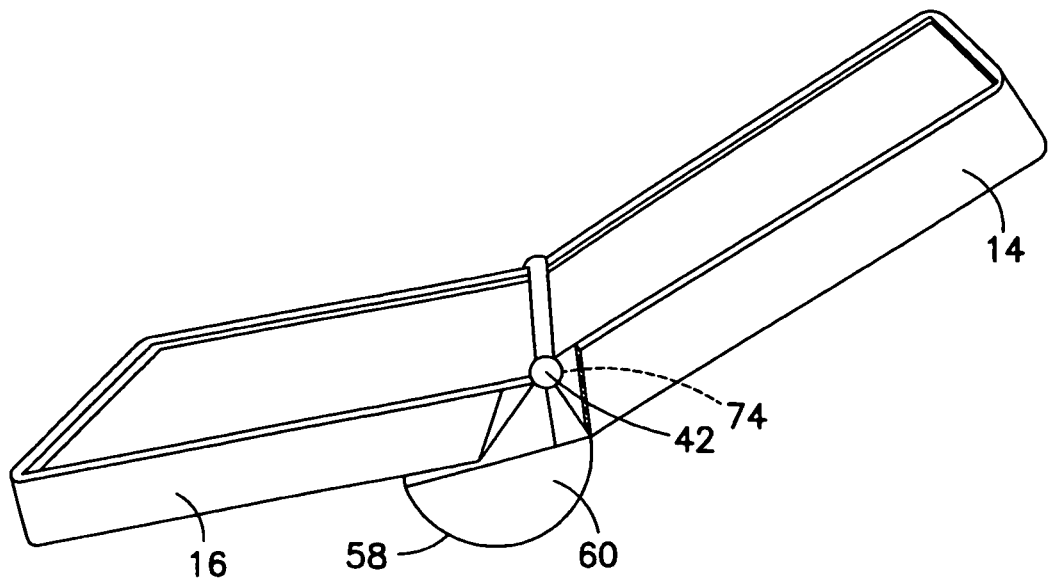
FIG. 6 is a side view similar to FIGS. 4 and 5, but showing the apparatus in another intermediate unfolded position.
Figure 7:
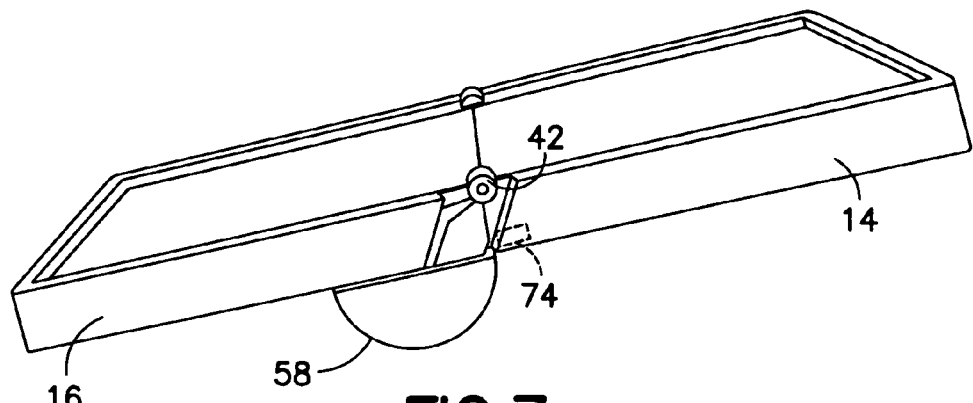
FIG. 7 is a side view similar to FIG. 4, but showing the apparatus in the fully open, unfolded positions shown in FIG. 2.

In the closed configuration shown in FIGS. 1 and 4, the two electronic displays 34, 38 face each other to generally protect and cover each other. In an alternate example embodiment one or more additional displays could be provided on the back side of the housing sections 32 and/or 36 to be viewable while the apparatus is in the closed configuration. FIGS. 4-7 shown reconfiguration of the apparatus 10 between the folded, closed configuration shown in FIG. 4, and the unfolded, open configuration shown in FIG. 7. As a user flips the first section 14 away from the second section 16, the two sections 14, 16 rotate open at the joint hinges 42. The axis of rotation of the joint hinges 42 is slightly above the edges 52, 56 so the edges do not contact each other during the opening rotation. The cover 58 pivots on the first section 14 at hinges 68. The cover 58 both pivots relative to the second section section 16 by use of slide 70 and pivot 72 until the final unfolded, open position is reached; about 180 degrees open as shown in FIG. 7. The cover 58 has rotated and slid under the second housing section 36. The cover 58 has also merely rotated relative to the first housing section 32. A position location system 74, such as a detent system, could be provided to have an intermediate locked position as shown in FIG. 6 where the first section 14 is opened more than 90 degrees, but less than 180 degrees. The position location system could additionally or alternatively retain the two sections 14, 16 parallel or in a same plain, such as with a magnetic latch for example, as illustrated by FIG. 7.

Figure 8:
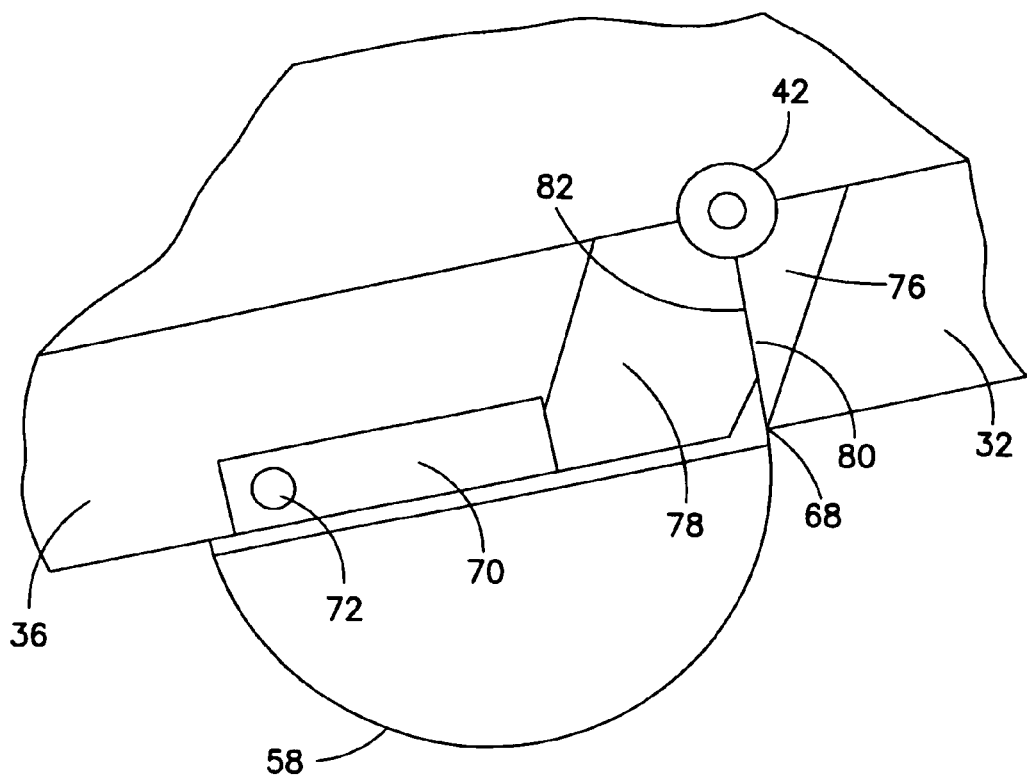
FIG. 8 is an enlarged view of the joint shown in FIG. 7.

As seen best in FIG. 8, in this example embodiment the opposite sides 44, 46 of the first and second housing sections 32, 36 have recesses 76, 78 at their ends 80, 82. The recesses 76, 78 provide spaces for the end walls 60 (see FIG. 11) of the cover 58 to be located in at the folded, closed position (FIG. 4) and intermediate positions (FIGS. 5-6). However, in an alternate example the recesses 76, 78 might not be provided. As illustrated in FIG. 11, the cover 58 forms a receiving area 84. This receiving area 84 receives the ends 80, 82 in the folded closed position (FIG. 4) and thereby protects the exposed ends 50, 54 of the displays 34, 38 in the closed position. The receiving area 84 also provides a path for electrical conductors to extend between the first and second sections 14, 16; perhaps restrained against the inside surface of the curved wall 62 to prevent being pinched between the ends 80, 82 when the apparatus 10 is unfolded.

Figure 12:
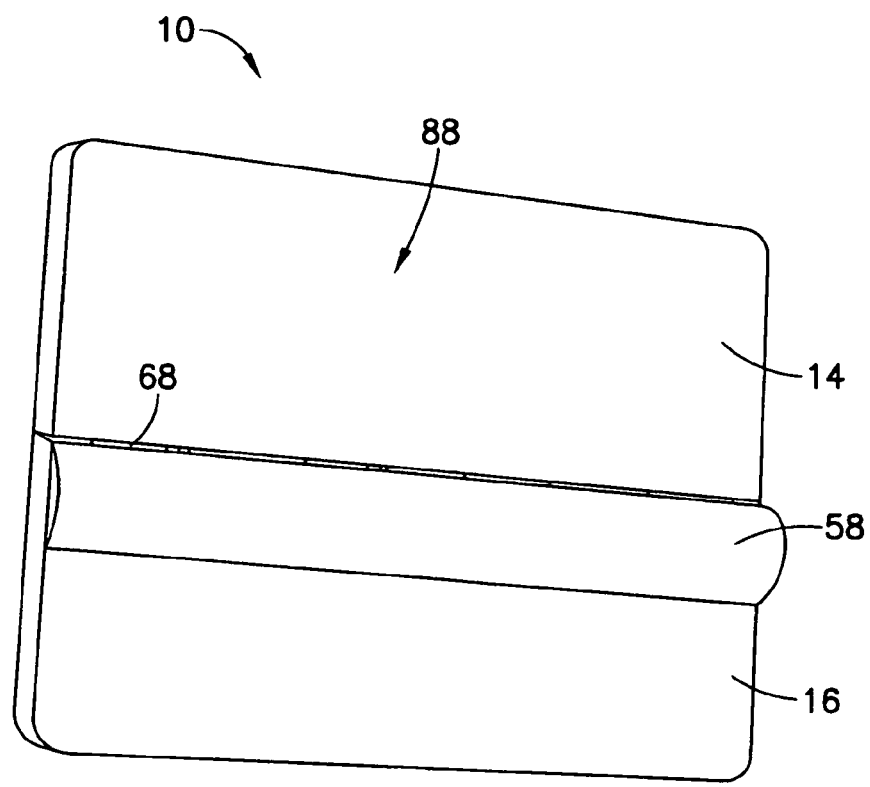
FIG. 12 is a rear side view of the apparatus shown in FIGS. 2 and 7 in the unfolded configuration.

As illustrated by FIGS. 2 and 12, when the apparatus is unfolded, the cover 58 projects from the back of the apparatus 10. The apparatus 10 is able to rest on a surface S at an angle for viewing by a user. As seen in FIG. 2, the apparatus 10 can rest on the surface S at the cover 58 and the end 86 of the first section 14. The rear 88 of the apparatus 10 in the open position also provides an ergonomic shape for better holding in a hand of the user because of the projection provided by the cover 58; so the apparatus 10 is less likely to slip out of the hand of the user. However, in an alternate example embodiment other shapes of the cover or wall 62 could be provided.

Figure 13:
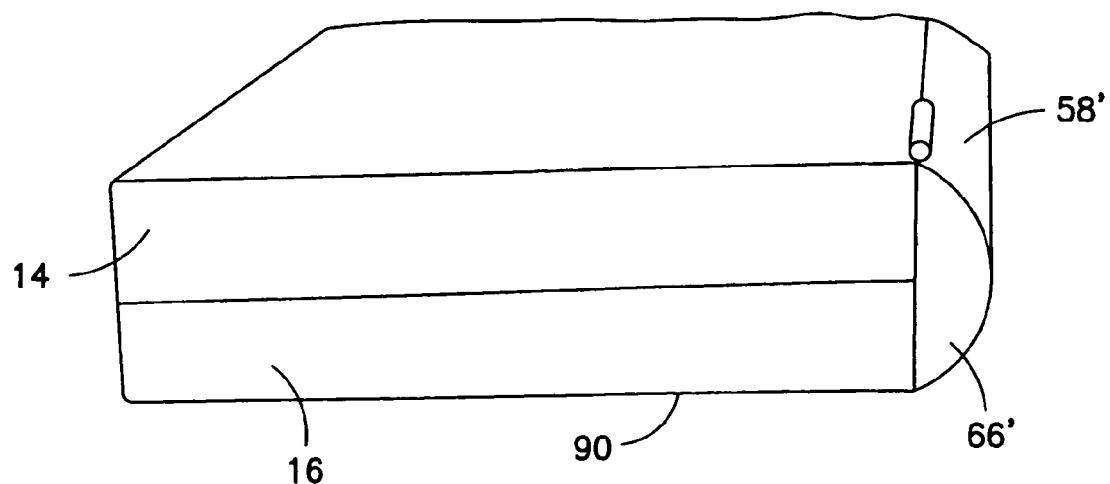
FIG. 13 is a side view of an alternate example embodiment of the apparatus in a closed configuration.

Referring also to FIG. 13 an alternate example embodiment is shown where the end 66' of the cover 58' does not extend below the bottom 90 of the second section 16 in the folded closed position.

Figure 14:
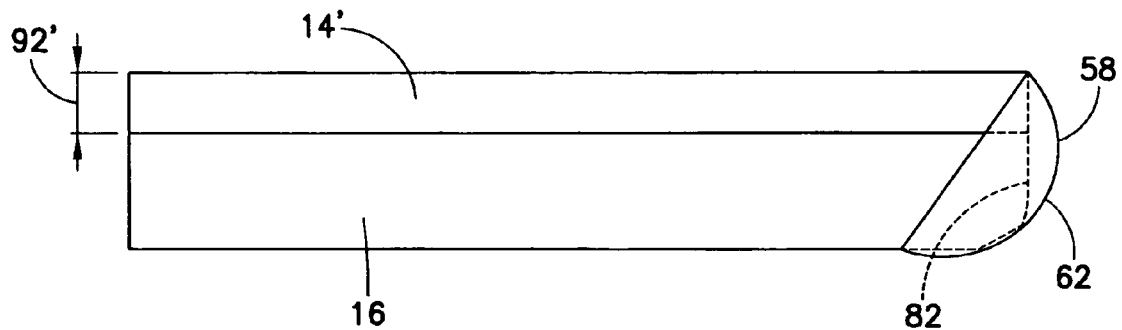
FIG. 14 is a schematic side view of another alternate example embodiment, shown in a closed configuration.
Figure 15:
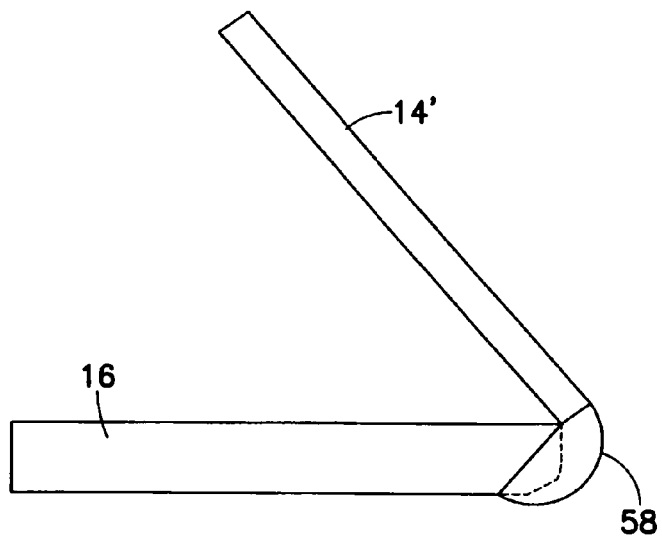
FIG. 15 is a schematic side view as in FIG. 14 showing the apparatus in an intermediate unfolded configuration.
Figure 16:
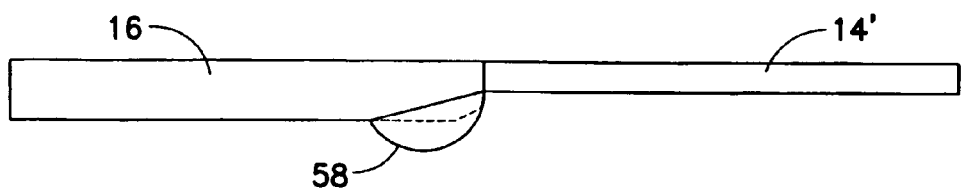
FIG. 16 is a schematic side view as in FIG. 14 showing the apparatus in a fully open unfolded configuration.
Figure 17:
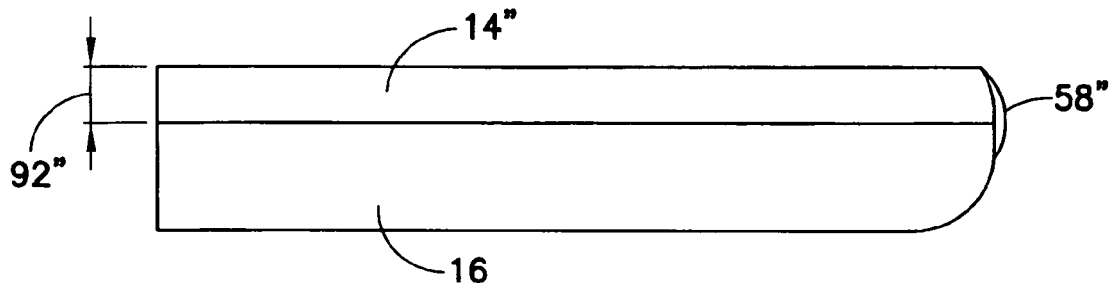
FIG. 17 is a schematic side view of another alternate example embodiment, shown in a closed configuration.
Figure 18:
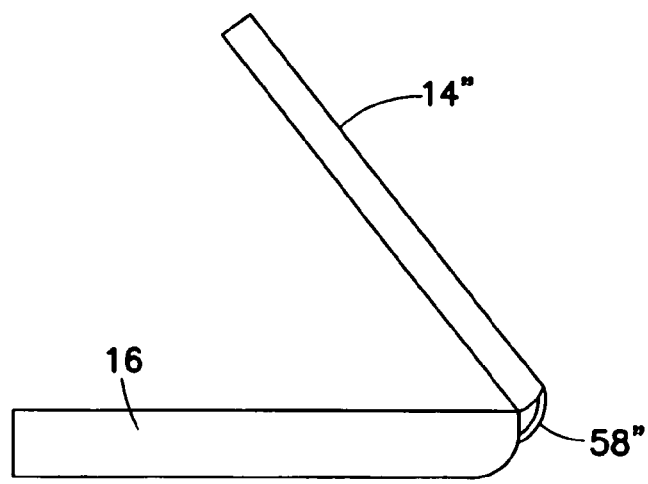
FIG. 18 is a schematic side view as in FIG. 17 showing the apparatus in an intermediate unfolded configuration.
Figure 19:
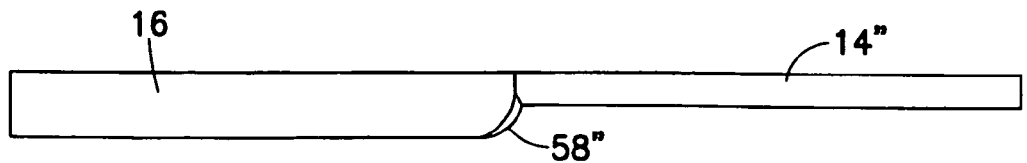
FIG. 19 is a schematic side view as in FIG. 17 showing the apparatus in a fully open unfolded configuration.
Figure 20:
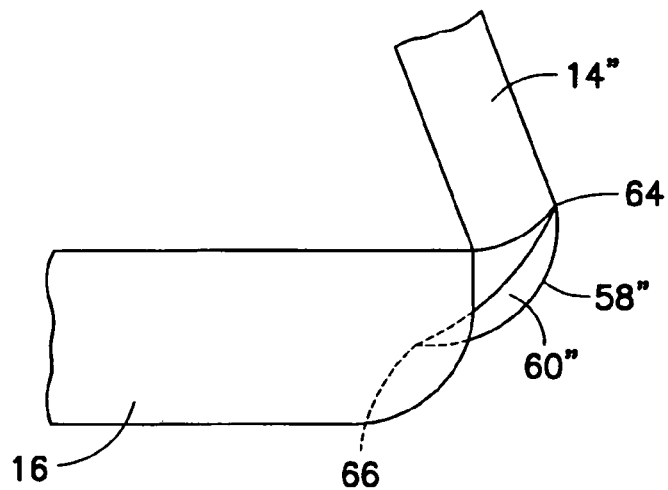
FIG. 20 is an enlarged view of the joint shown in FIG. 18.

Referring also to FIGS. 14-16 an alternate example embodiment is shown where the thickness or height 92' of the first section 14' is smaller than the height (see FIG. 4) of the first section 14. The cover 58 covers a portion of the second section 16 in the unfolded, open configuration. The lower edge of the end 82 is also slightly recessed to accommodate the wall 62 in the folded, closed configuration.

Referring also to FIGS. 17-20 an alternate example embodiment is shown where the thickness or height 92" of the first section 14" is smaller than the height 92 of the first section 14. The cover 58" has end walls 60" with a general crescent shape. The radius of the cover 58" is smaller than the radius of the wall 62. The end 64 is pivotably connected to the first section 14". The opposite end 66 is slideably and rotatably connected to the second section 16. In this example the end walls 60" do not extend alongside the outer opposite sides of the first and second sections. The end walls 60" can move into interior recesses in the second section 16 in the unfolded, open configuration.

Figure 21:
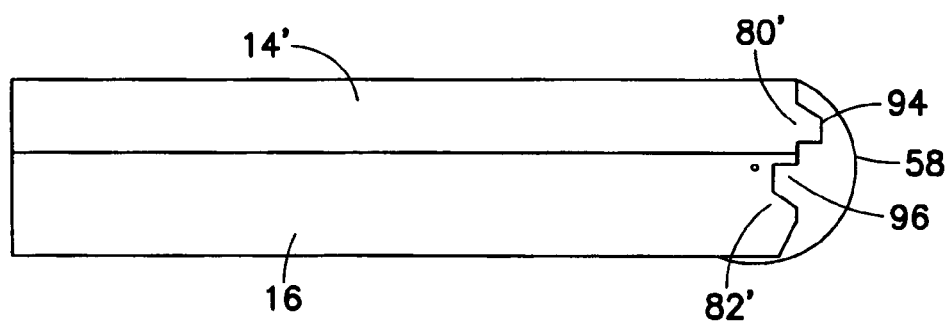
FIG. 21 is a schematic side view of another alternate example embodiment, shown in a closed configuration.
Figure 22:
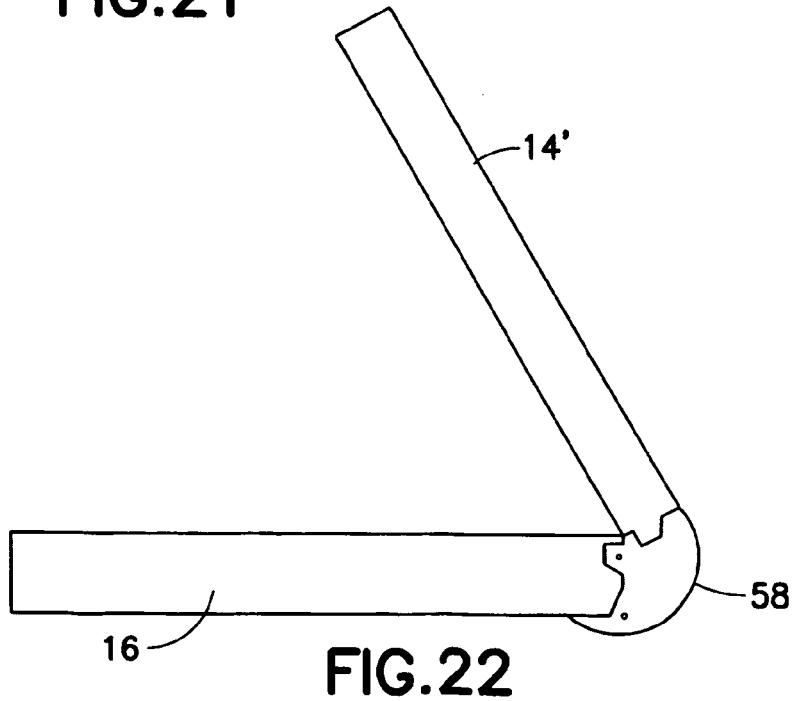
FIG. 22 is a schematic side view as in FIG. 21 showing the apparatus in an intermediate unfolded configuration.
Figure 23:
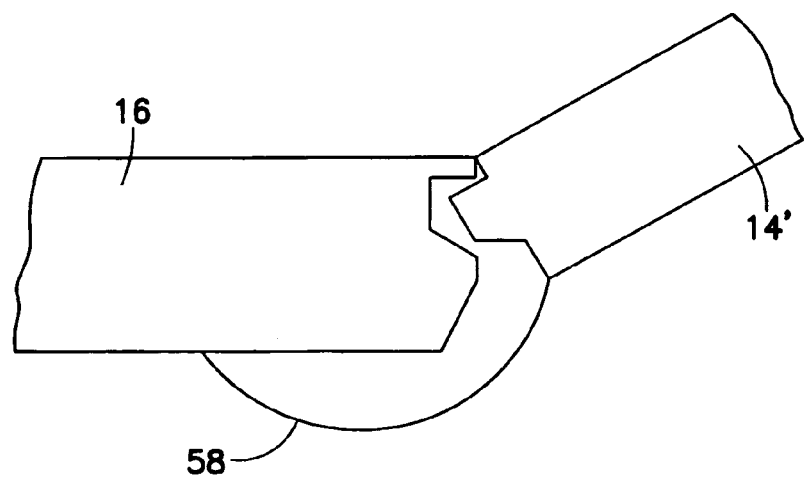
FIG. 23 is an enlarged partial schematic side view as in FIG. 21 showing the joint of the apparatus in another intermediate unfolded configuration.
Figure 24:
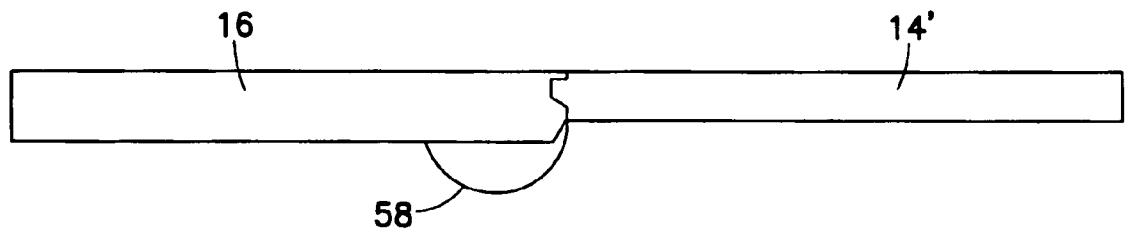
FIG. 24 is a schematic side view as in FIG. 21 showing the apparatus in a fully open unfolded configuration.
Figure 25:
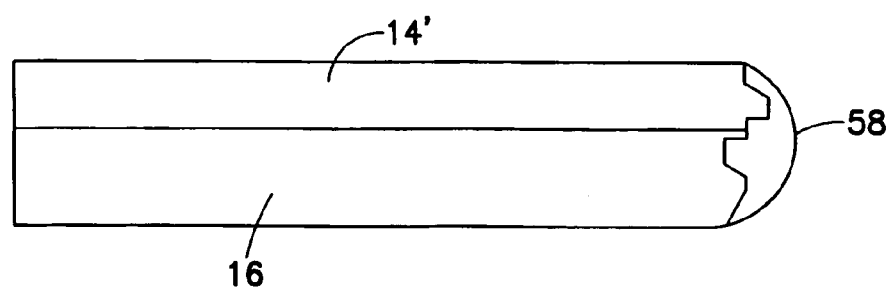
FIG. 25 is a schematic side view of another alternate example embodiment, shown in a closed configuration.

Referring also to FIGS. 21-24 an alternate example embodiment is shown where the ends 80', 82' of the first and second sections 14', 16 comprise at least one mating projection 94 and recess 96. The mating projection 94 and recess 96 form an interlock in the unfolded, open position as shown in FIG. 24 to strengthen the joint between the first and second sections 14', 16 in the open configuration. The projection 94 can extend into the cover's receiving area 84 (see FIG. 11) in the folded, closed configuration as schematically illustrated in FIG. 21. Otherwise, the first and second connection sections are the same as the first example described with reference to FIGS. 1-9. Referring also to FIG. 25 an alternate example embodiment is shown similar to FIGS. 21-24, but with the cover 58' as shown in FIG. 13.

Figure 27:
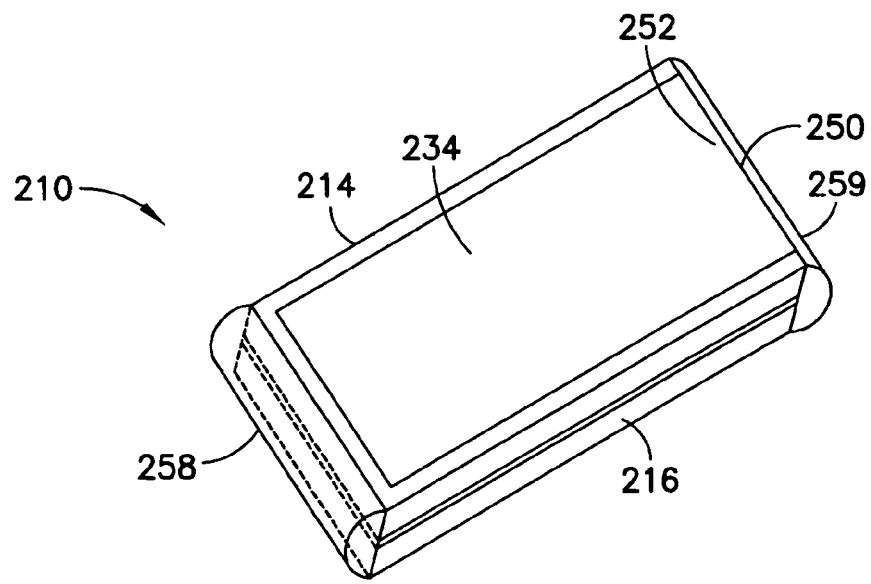
FIGS. 27-29 show perspective views of another example embodiment in closed, intermediate and open configurations.
Figure 28:
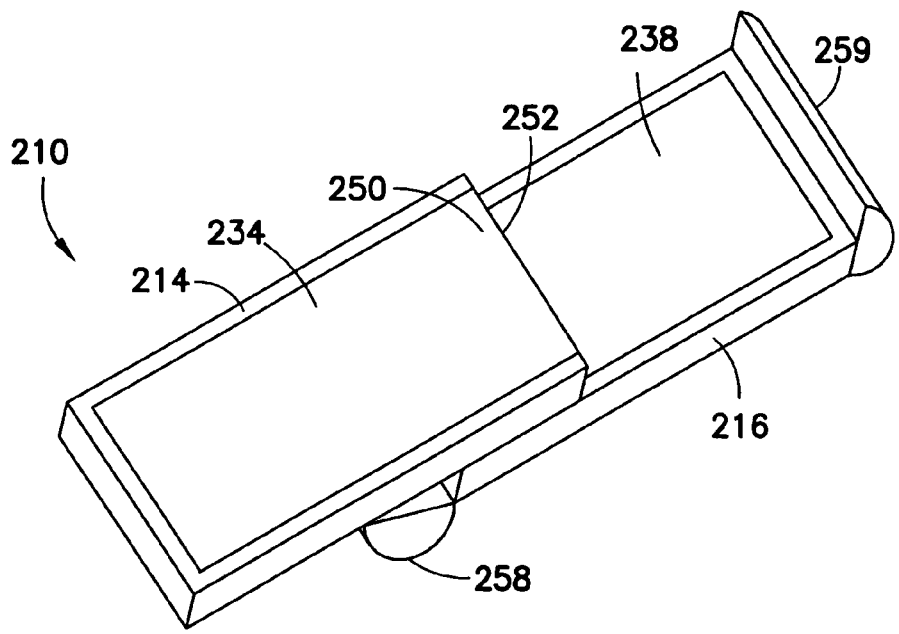
Figure 29:
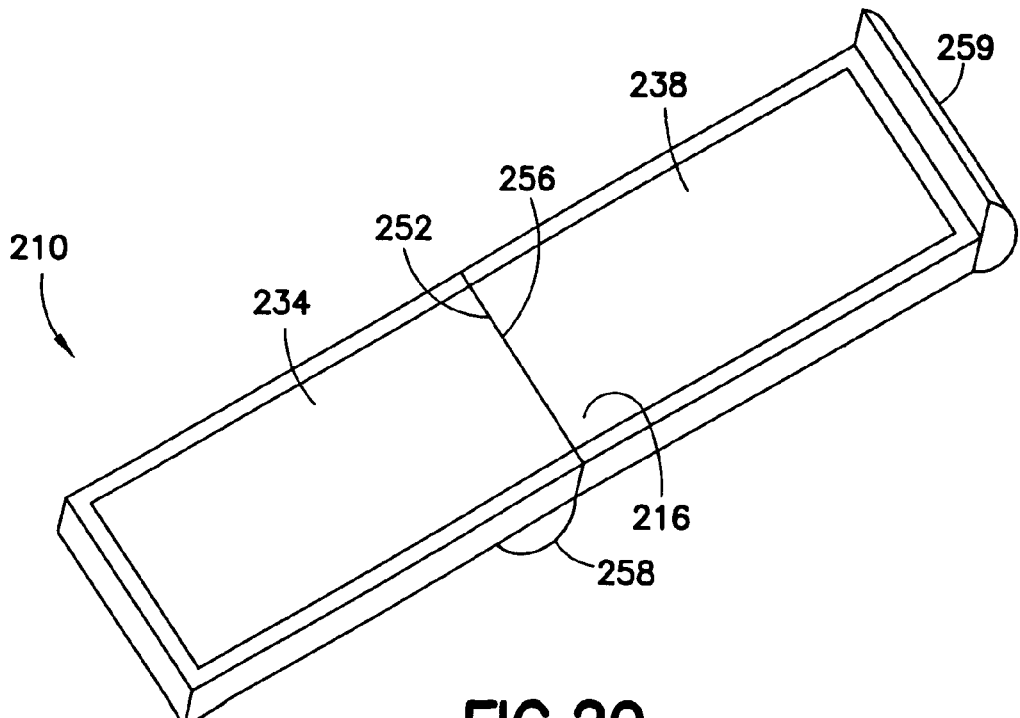

FIGS. 27-29 illustrate another example embodiment where an apparatus 210 has two sections 214, 216 movably connected to each other. The first section 214 is slideably connected to the second section 216 from a first closed position as shown in FIG. 27 to a second open position as shown in FIG. 29. The first section 214 has a display 234 on its top side with an edge 252 at an end 250. The second section 216 has a display 238 on its top side with an edge 256 at an end 254. The apparatus 210 has two covers 258, 259 for the edges 252, 256 when the apparatus is in the closed configuration (FIG. 27). The first cover 258 is pivotably connected to the end 254 of the second section 216. The second cover 259 is stationarily connected to the opposite end of the second section 216.

In the closed configuration, the first cover 258 covers the edge 252, and the second cover 259 covers the edge 256. As the two sections 214, 216 are slid open, the first cover 258 pivots down. As the two sections 214, 216 approach the fully open position, the two sections 214, 216 translate into a generally same plane; with motion generally perpendicular to the first sliding motion. The two edges 252, 256 are, thus, positioned directly opposite each other and protect each other. This allows the two displays 234, 238 to look like a single display because the edges 252, 256 directly face each other without portions of the housings therebetween.

FIGS. 30 and 31 illustrate another example embodiment where an apparatus 310 has three sections 312, 314, 316 movably connected to each other at two joints 318, 320. The joints 318, 320 are each identical to the joints described with reference to FIG. 1 with the joint hinges 42, cover 58, and members 68, 70 and 72. The middle section 312 has a display 334 with two exposed edges 352, 353 at its opposite ends 350, 351. In the unfolded, open position shown in FIG. 31, these edges 352, 353 directly face the exposed edges 356, 357 of the displays 338, 339 of the second and third sections 314, 316. This example illustrates that features can be used in an apparatus that has more than two movable sections.

Providing a big display for a pocketable device has been a challenge in the past. If there are two displays, typically a distance or spacing between the two displays is too long so that a user would think those two displays were one continuous display area. Features, as explained from the example embodiments, can provide a hinge mechanism which is novel and provides a very small gap between two displays.

Advantages of features explained from the example embodiments include:
 small gap between two displays;
 robust mechanism covers vulnerable display edges in closed configuration;
 wires between first and second sections are easy to provide under the cover part;
 ergonomics;
 good grip from cover part;
 hinge cover part can work as a table support in an open configuration;
 easy to make bi-stable opening mechanism, such as with a spring at the second connection section; and
 possibility to position the lid into some angle, more than 90 degrees and less than 180 degrees, such as for typing on one section (with a touch screen virtual display keypad)

while the other section functions as a display, while the apparatus is on a table or in the user's hands for example.

Features as described from the example embodiments enable a manufacturer to put two displays as close as possible in a folding pocketable device. A very small gap can be provided between the two displays. The apparatus could be, for example, a mobile terminal or a PDA. A dual display device can be provided where two display panels are as close to each other as possible in an open configuration. Edges of a display are inherently vulnerable. Features of the example embodiments described above can still protect those edges even if at least portions of those edges are not protected by the housing sections.

Figure 26:
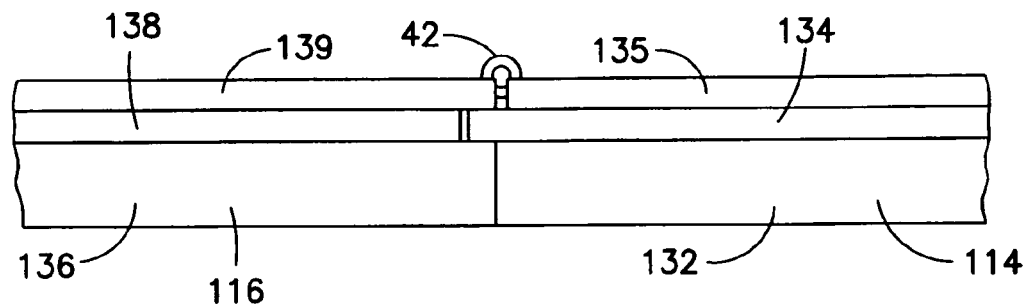
FIG. 26 is a schematic illustration of the joint of another alternate example embodiment, shown in an open configuration.

The cover can be connected with a hinge to an upper part (such as first section 14), and connected with a sliding mechanism to a lower part (such as second section 16). The cover can hide technical features extending between the upper and lower parts. With this mechanism, it is also easy to make displays overlap in an open configuration. As example of this is shown in FIG. 26 where display 134 is partially located under display 138. For example, a portion of the display 134 could extend under the window 139 of the display 138, and the two windows 135, 139 could almost meet.

In example shown in FIG. 13, the hinge cover is in a vertical position when the apparatus in closed. For the example of FIGS. 1 and 4, the hinge cover is at an angle. This gives some advantages including:

Easy to make bi-stable action with one spring;
Electrical connections (flex/coax) are more easy to make, cover part covers more that lower block;
Device appearance makes a statement of a new product configuration not seen before in a hand-held portable electronic device;
Good grip from cover when apparatus is open;
Spring mechanism can be provided to bias the two sections 14, 16 open and/or closed, where the spring could be between hinge cover part and second section 16; and
Narrow hinges could be provided between the first and second sections to maximize the display area.

In an open mode, the cover part can work as a table support. The hinges 68 can be tiny hinges to connect the cover part 58 to upper part 14. The display panels can be located very close to each other in the open configuration, such as less than 2 mm for example. The vulnerable display edges can be covered with the hinge cover 58.

Different options for the cover part design can include:
Interface to main blocks in ends can be curved. Curved could follow the movement better. The shape of the ends of the main blocks can also effects how the apparatus looks in an open state.
There could be a rail and follower system between the cover part and lower main block. This could prevent parts touching in wrong places, the lid/cover part opening in a wrong position, and a more robust design. The rail or slide 70 can be straight, but most probably some curved shape would be most efficient. System can be visible, or not visible (closer to center of the apparatus if desired).
One feature is to make the cover totally symmetric. The advantage is, of course, a symmetric look. However, in an alternate example, it might not be symmetric.

The lower block 16 could have a very large battery and quality stereo, such as IHF stereo for example, and the upper block 14 could be provided the engine, antennas, and perhaps a third display. Thus, it should be understood that features described herein could be used with an apparatus having more than two movable sections.

An example embodiment may be provided as an apparatus 10 comprising a cover 58; a first connection section comprising a first hinge 68 connected to a first end 64 of the cover, where the first hinge is configured to pivotably connect the first end of the cover to a first housing section 14; and a second connection section connected to a second end 66 of the cover, where the second connection section is configured to connect the second end of the cover to a second housing section 16 which is pivotably connected to the first housing section, where the second connection section is configured to provide both rotational and longitudinal sliding motion of the second end of the cover on the second housing section.

The cover may comprise a rigid cover member 58 forming the first end of the cover and the second end of the cover. The cover may comprise end walls 60 which are configured to partially extend over edges 46 of the first and second housing sections, and a receiving area 84 between the end walls. The cover may comprise a general curved shape between the ends walls, where opposite ends 64, 66 of the curved shape form the first and second ends of the cover. The second connection section may comprise a slide 70 and a pivot 72, where the pivot rotatably connects the second end 66 of the cover to the slide, and where the slide is configured to be longitudinally slideably connected to the second housing section 16. The apparatus may comprise the first section 14 comprising the first housing section 32 and the second section 16 comprising the second housing section 36, where the first and second housing sections each comprises a display 34, 38 on their respective housing sections, and where joint hinges 42 at only opposite ends of the first and second housing sections pivotably connect the first and second housing sections to each other. The apparatus may further comprise a first section 14 comprising the first housing section 32, where the first section comprises a first display 34 on the first housing section; a second section 16 comprising the second housing section 36, where the second section comprises a second display 38 on the second housing section; and at least one joint hinge 42 pivotably connecting the first and second housing sections to each other, where the at least one joint hinge is not located between the first and second displays in any configuration of the first and second sections relative to each other. At least a portion of a first edge 52 of the first display 34 is located at a side 80 of the first section without the first housing section covering the first edge portion 52. At least a portion of a second edge 56 of the second display 38 is located at a side 82 of the second section without the second housing section covering the second edge portion 56, and where the first and second edge portions 52, 56 directly face each other in an open configuration of the first and second sections 14, 16. The cover may comprise end walls; and a receiving area between the end walls, where, in a closed configuration of the first and second sections, the end walls are configured to cover the at least one joint hinge, and at least partially cover opposite sides of the first and second housing sections. The first and second housing sections may comprise recesses in the opposite sides, where the end walls extend into the recesses in a closed configuration of the first and second sections.

An example embodiment may be provided as an apparatus 10 comprising a first section 14 comprising a first housing 32 and a first display 34 on the first housing; a second section 16 comprising a second housing and a second display 38 on the second housing; a connection 42 between the first and second sections to allow the first section to rotate relative to the second section between a closed configuration and an open configuration, where in the open configuration opposite side edges of the first and second displays are in close proximity to each other and the first and second displays are viewable from a same direction; and a cover 58 comprising a rigid cover member, where, in the closed configuration, the rigid cover member at least partially covers ends 50, 80, 54, 82 of the first and second sections at a same side of the apparatus (see FIG. 4), and where the rigid cover member has a first end 62 pivotably connected to the first housing and an opposite second end 66 pivotably connected to the second housing.

The connection may comprise joint hinges 42 pivotably connecting the first and second housings to each other, where the joint hinges are not located between the opposite side edges of the first and second displays 34, 38. In the closed configuration, the rigid cover member covers the opposite side edges 52, 56 of the first and second displays. The opposite second end 66 of the cover may be longitudinally slideably connected to the second housing. At least a portion of the side edge 56 of the first display may be located at the end of the first section 14 without the first housing 32 covering the portion of the side edge of the first display. The rigid cover member 58 may comprise end walls 60; and a receiving area 84 between the end walls, where, in a closed configuration, the end walls 60 cover at least one joint hinge 42 connecting the first and second sections together as at least part of the connection, and at least partially cover opposite sides 44, 46 of the first and second housings. The first and second housings 32, 36 may comprise recesses 76, 78 in the opposite sides 44, 46, and the end walls 60 may extend into the recesses in the closed configuration.

Figure 32:
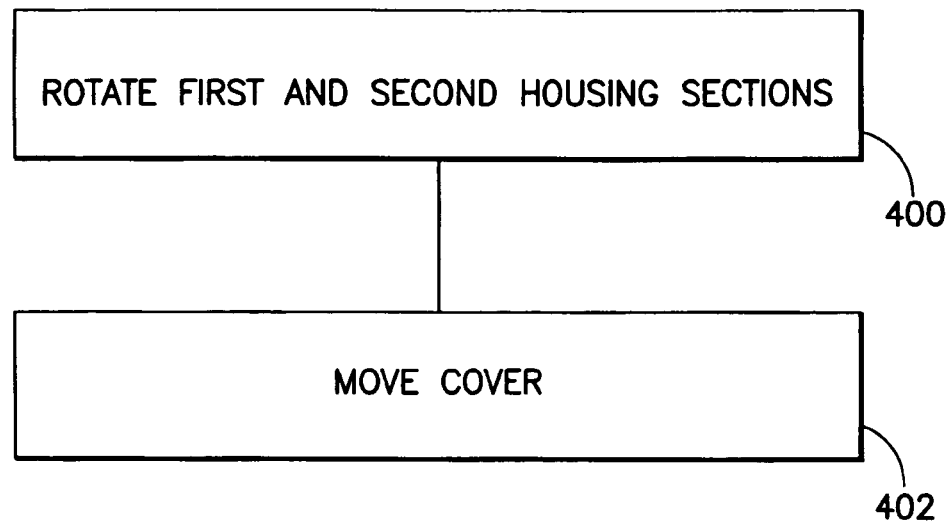
FIG. 32 is a diagram illustrating one example method.

As illustrated in FIG. 32, one example method may comprise pivotably rotating 400 a first housing section relative to a second housing section at a joint hinge from a closed folded configuration to an open unfolded configuration, where the first and second housing sections each comprise a display which generally face a same direction in the open configuration, and where ends of the displays are substantially adjacent each other in the open configuration; and moving a cover 402 from a first location, at first sides of the first and second housing sections in the closed configuration, to a second location away from an area between the first sides of the first and second housing sections in the open configuration, where the first sides face each other in the open configuration, and where the cover pivots at a first hinge between the cover and the first housing section.

Figure 33:
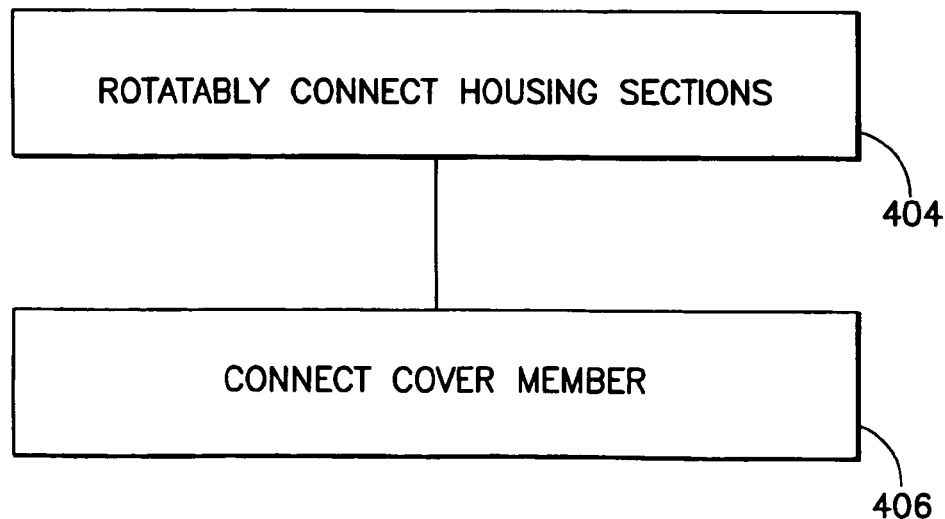
FIG. 33 is a diagram illustrating another example method.

As illustrated in FIG. 33, another example method may comprise rotatably connecting 404 a first housing section to a second housing section at a joint between a closed folded configuration and an open unfolded configuration, where the first and second housing sections each comprise a display with ends which are substantially adjacent and directly facing each other in the open configuration; and connecting 406 a cover member to the first and second housing sections at the joint, where a first end of the cover member is pivotably connected to the first housing section and an opposite second end of the cover member is both pivotably and longitudinally slideably connected to the second housing section.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
a first section comprising a first housing section, where the first section comprises a first display on the first housing section;
a second section comprising a second housing section, where the second section comprises a second display on the second housing section;
a cover;
a first connection section comprising a first hinge connected to a first end of the cover, where the first hinge pivotably connects the first end of the cover to the first housing section; and
a second connection section connected to a second end of the cover, where the second connection section connects the second end of the cover to the second housing section, where the second connection section is configured to provide both rotational and longitudinal sliding motion of the second end of the cover on the second housing section; and
at least one joint hinge pivotably connecting the first and second housing sections to each other, where the at least one joint hinge is not located directly between the first and second displays in any configuration of the first and second sections relative to each other.

2. An apparatus as in claim 1 where the cover comprises a rigid cover member forming the first end of the cover and the second end of the cover.

3. An apparatus as in claim 1 where the cover comprises end walls which are configured to partially extend over edges of the first and second housing sections, and a receiving area between the end walls.

4. An apparatus as in claim 3 where the cover comprises a general curved shape between the ends walls, where opposite ends of the curved shape form the first and second ends of the cover.

5. An apparatus as in claim 1 where the second connection section comprises a slide and a pivot, where the pivot rotatably connects the second end of the cover to the slide, and where the slide is configured to be longitudinally slideably connected to the second housing section.

6. An apparatus as in claim 1 where the at least one joint hinges are at only opposite ends of the first and second housing sections to pivotably connect the first and second housing sections to each other.

7. An apparatus as in claim 1 where at least a portion of a first edge of the first display is located at a side of the first section without the first housing section covering the first edge portion.

8. An apparatus as in claim 7 where at least a portion of a second edge of the second display is located at a side of the second section without the second housing section covering the second edge portion, and where the first and second edge portions directly face each other in an open configuration of the first and second sections.

9. An apparatus as in claim 1 where the cover comprises:
end walls; and
a receiving area between the end walls,
where, in a closed configuration of the first and second sections, the end walls are configured to cover the at least one joint hinge, and at least partially cover opposite lateral sides of the first and second housing sections.

10. An apparatus as in claim 9 where the first and second housing sections comprise recesses in the opposite lateral sides, and where the end walls extend into the recesses in a closed configuration of the first and second sections.

11. An apparatus comprising:
a first section comprising a first housing and a first display on the first housing;
a second section comprising a second housing and a second display on the second housing;
a connection between the first and second sections to allow the first section to rotate relative to the second section between a closed configuration and an open configuration; and
a cover located proximate the connection,
where, in the closed configuration, the cover at least partially directly covers side edges of the first and second displays at ends of the first and second sections at a same side of the apparatus, and
where, in the open configuration the side edges of the first and second displays directly face each other and the first and second displays are viewable from a general same direction,
where the cover comprises a rigid cover member with a first end pivotably connected to the first housing and an opposite second end pivotably connected to the second housing, where the rigid cover member comprises end walls,
where the first and second housings comprises recesses in opposite lateral sides, and where the end walls extend into the recesses in the closed configuration.

12. An apparatus as in claim 11 where, in the closed configuration, the rigid cover member covers opposite lateral side edges of the first and second displays.

13. An apparatus as in claim 11 where the opposite second end of the cover is longitudinally slideably connected to the second housing.

14. An apparatus as in claim 11 where the rigid cover member comprises:
a receiving area between the end walls,
where, in a closed configuration, the end walls cover at least one joint hinge connecting the first and second sections together as at least part of the connection, and at least partially cover opposite sides of the first and second housings.

15. An apparatus as in claim 11 where the connection comprises joint hinges pivotably connecting the first and second housings to each other, where the joint hinges are not located directly between the opposite side edges of the first and second displays.

16. An apparatus as in claim 11 where at least a portion of the side edge of the first display is located at the end of the first section without the first housing covering the portion of the side edge of the first display.

17. A method comprising:
rotatably connecting a first housing section to a second housing section by a connection at a joint between a closed folded configuration and an open unfolded configuration, where the first and second housing sections each comprise a display with ends which are substantially adjacent and directly facing each other in the open configuration, where the connection comprises at least one joint hinge pivotably connecting the first and second housing sections to each other, where the at least one joint hinge is not located directly between the first and second displays in any configuration of the first and second sections relative to each other; and
connecting a cover member to the first and second housing sections at the joint, where a first end of the cover member is pivotably connected to the first housing section and an opposite second end of the cover member is both pivotably and longitudinally slideably connected to the second housing section.

18. An apparatus comprising:
a first section comprising a first housing section, where the first section comprises a first display on the first housing section;
a second section comprising a second housing section, where the second section comprises a second display on the second housing section;
a cover;
a first connection section comprising a first hinge connected to a first end of the cover, where the first hinge is pivotably connects the first end of the cover to the first housing section; and
a second connection section connected to a second end of the cover, where the second connection section connects the second end of the cover to the second housing section, where the second connection section is configured to provide both rotational and longitudinal sliding motion of the second end of the cover on the second housing section; and
at least one joint hinge directly pivotably connecting the first and second housing sections to each other, where the at least one joint hinge is located outside of an area directly between the first and second displays.

* * * * *